United States Patent [19]

Matsuo et al.

[11] Patent Number: 4,492,620
[45] Date of Patent: Jan. 8, 1985

[54] PLASMA DEPOSITION METHOD AND APPARATUS

[75] Inventors: Seitaro Matsuo; Toshiro Ono, both of Isehara, Japan

[73] Assignee: Nippon Telegraph & Telephone Public Corporation, Tokyo, Japan

[21] Appl. No.: 530,671

[22] Filed: Sep. 9, 1983

[30] Foreign Application Priority Data

Sep. 10, 1982 [JP] Japan ............... 57-156843
Aug. 26, 1983 [JP] Japan ............... 58-155097

[51] Int. Cl.³ ............................................. C23C 15/00
[52] U.S. Cl. .................................. 204/192 R; 204/298
[58] Field of Search ................... 204/192 R, 298; 118/723

[56] References Cited

U.S. PATENT DOCUMENTS 4,356,073 10/1982 McKelvey ............... 204/298
4,361,472 11/1982 Morrison, Jr. ........... 204/192 R
4,401,054 8/1983 Matsuo et al. ........... 118/723

Primary Examiner—John E. Kittle
Assistant Examiner—James J. Seidleck
Attorney, Agent, or Firm—Cushman, Darby & Cushman

[57] ABSTRACT

A plasma deposition apparatus comprising a plasma formation chamber into which a gas is introduced to produce plasma, a specimen chamber in which a specimen table is disposed for placing thereon a speciment substrate on which a thin film is to be formed, a plasma extraction window interposed between the plasma formation chamber and the specimen chamber, a target which is made of a sputtering material and is interposed between the plasma extraction window and the specimen table, a first means for extracting ions for sputtering the target from a plasma stream extracted from the plasma formation chamber to impinge against the target, and a second means for extracting the plasma stream through the plasma extraction window into the specimen chamber and for transporting the sputtered and ionized atoms to the specimen substrate period on the specimen table. A high quality thin film of various metals and metal compounds can be formed at a low temperature and a thin film is formed, while characteristics or properties of the thin film to be formed is controlled.

16 Claims, 14 Drawing Figures

FIG_2
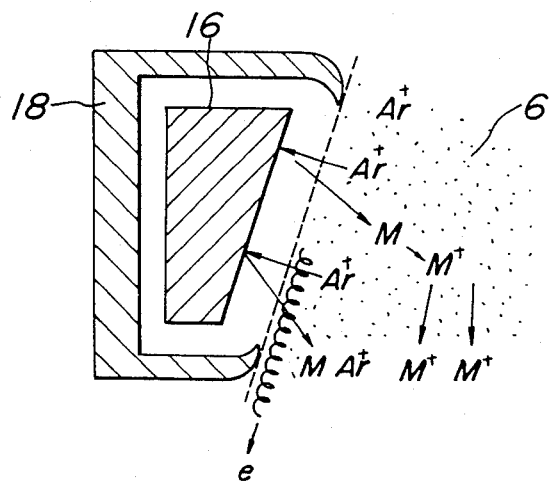
FIG_3
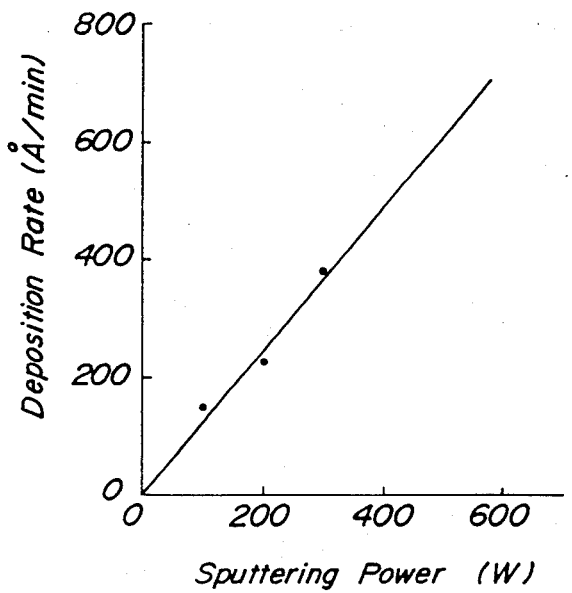

FIG_7

PLASMA DEPOSITION METHOD AND APPARATUS

BACKGROUND OF THE INVENTION

1. Field of the Invention

The present invention relates to a plasma deposition method and apparatus for depositing a thin film of various materials over the surface of a substrate in the case of fabrication of electronic devices such as semiconductor integrated circuits and more particularly to a plasma deposition method and apparatus for forming a high quality thin film of metals or metal compounds at a low temperature by utilizing plasma.

2. Description of the Prior Art

Apparatus for depositing thin films by utilizing plasma may generally be classified into a sputtering apparatus and a plasma CVD apparatus. The sputtering apparatus is mainly used to deposit films of metals or metal compounds, while the plasma CVD apparatus is mainly used to deposit a thin film of a material including silicon such as $SiO_2$, $Si_3N_4$, Si or the like.

As far as a way of supplying a raw materials, the sputtering device uses a target of a solid material which is subjected to bombardment of ions so that sputtered atoms ejected from the solid target are deposited over the surface of a substrate on which a film is to be formed. In the plasma CVD apparatus, raw materials such as $SiH_4$, $N_2$ or $O_2$ are supplied in the form of a gas to be decomposed and reacted so as to form an $Si_3N_4$ or $SiO_2$ film over the surface of a substrate.

According to a conventional high-frequency discharge plasma CVD process, there are disadvantages in that a specimen substrate must be heated at 250°–400° C. and that a quality of a film such as density of an $Si_3N_4$ film is not satisfactory.

In U.S. Pat. No. 4,401,054, there is a disclosure of a plasma deposition apparatus in which plasma is produced by utilizing a microwave discharge using electron cyclotron resonance (ECR) and the plasma is extracted toward a specimen table by means of a diverging magnetic field so that an ion bombardment occurs with suitable energies. According to this process, a dense and high quality silicon film such as $Si_3N_4$ comparable with that obtained by a high temperature CVD method can be obtained at a low temperature without heating the substrate.

If, however, it is desired to deposita film of a metal or a metal compound there is no suitable gas available. In the case of forming a film of silicon, $SiH_4$ gas can not be used, and the compounds which can be supplied in the form of gas are limited to halogen compounds such as flourides, chlorides or bromides. In order to supply such halogen compounds to the apparatus, a special gas introduction system as well as heating are required. In addition, the decomposition by plasma is difficult or unstable. Therefore, there is a disadvantage that it is difficult to obtain a high quality film.

According to the conventional sputtering method, atoms which impinge against a specimen substrate are not ionized in order to promote a reaction of forming a film and their energies are not controlled so that there is a disadvantage that a high quality film cannot be obtained at a low temperature and the adhesion of the film to the substrate is not satisfactory.

SUMMARY OF THE INVENTION

The present invention was made to overcome the above and other problems encountered in the conventional film deposition methods and apparatus and has for its object to provide a plasma deposition method which maintains the advantage of the conventional sputtering method that a raw material can easily be supplied and the advantage of the conventional ECR plasma deposition method that a dense and high quality thin film formed at a low temperature, and which can form a high quality thin film of a metal or a metal compound at a low temperature by solving the disadvantages of both the above-mentioned conventional methods.

Another object of the present invention is to provide a plasma deposition apparatus which has the above-mentioned advantages of both the conventional sputtering method and ECR plasma deposition method while eliminating their disadvantages and which can form a high quality thin film of various metals and metal compounds stably at a low temperature.

A further object of the present invention is to provide a plasma deposition apparatus which can widely control the properties of a thin film.

A still further object of the present invention is to provide a plasma deposition apparatus which ensures a high degree of adhesion strength of a thin film to a substrate.

A still further object of the present invention is to provide a plasma deposition apparatus in which the conditions for producing plasma and the conditions for depositing a film can substantially independently be controlled.

A yet further object of the present invention is to provide a plasma deposition apparatus whose maintenance is easy and which can improve the yield of thin film formation.

A still further object of the present invention is to provide a plasma deposition apparatus which can increase a target current and a deposition rate.

A yet further object of the present invention is to provide a plasma deposition apparatus in which targets made of various materials can easily be used.

In order to achieve these and other objects, in a plasma deposition method according to the present invention, a gas is introduced into a plasma formation chamber to produce plasma so that ions in a part of a stream of the plasma sputter a target consisting of a sputtering material and the atoms sputtered from the target are taken in the plasma stream and are ionized. The atoms thus sputtered and ionized are entrained into the plasma stream and transported to a specimen substrate so as to reach the substrate, thereby a thin film of the sputtering material or a thin film of a chemical compound or alloy including sputtered atoms is deposited thereon.

Plasma deposition apparatus in accordance with the present invention comprises a plasma formation chamber into which a gas is introduced to produce plasma; a specimen chamber in which a specimen substrate table is disposed for placing thereon a specimen substrate on which a thin film is to be formed and for depositing the thin film on the specimen substrate; a plasma extraction window interposed between the plasma formation chamber and the specimen chamber; a target which is made of a sputtering material and is interposed between the plasma extraction window and the specimen substrate table; a first means for extracting ions for sputtering the target from a plasma stream produced in the plasma formation chamber; and a second means for extracting the plasma stream through the plasma extraction window into the specimen chamber and for transporting the sputtered and ionized atoms to the specimen substrate placed on the specimen table. The ions in a part of the plasma stream sputter the target so that atoms sputtered from the target into the plasma stream are taken in the plasma stream and are transported to the specimen substrate so as to impinge against the specimen substrate. As a result, a thin film of the sputtering material or a thin film of a chemical compound or alloy including atoms of the sputtering material is formed on the specimen substrate.

Here, the target may be disposed in the vicinity of the plasma extraction window and adjacent to or in contact with the plasma stream.

The surface of the target which faces the plasma stream may be disposed in parallel with the plasma stream.

It is preferable that the target is in the form of a cylinder and is so disposed as to surrounded the plasma stream.

It is preferable that the surface of the cylindrical target which is to be sputtered is so disposed as to intersect with a part of the plasma stream.

It is preferable that the plasma formation chamber is so structured that is produced in the plasma chamber by a microwave discharge using electron cyclotron resonance.

In a preferred embodiment of the present invention, the second means comprises one or more magnetic coils having a diverging magnetic field with an intensity of magnetic field having a reducing gradient from the plasma formation chamber toward the specimen chamber.

It is preferable that the first means has a sputtering power supply connected in such a way that a negative voltage is applied to the target.

Furthermore, it is also preferable that the surface of the target which is opposite to the surface which faces the plasma stream is surrounded with a shield electrode.

Here, it is preferable that there is provided means for cooling the shield electrode so that the target is cooled by the transfer of heat radiated from the target to the cooling means.

In a further embodiment of the present invention, the cylindrical target may consist of a plurality of cylindrical segments or sections made of different materials and disposed in a coaxial relationship with each other.

Moreover, the cylindrical target may consist of a plurality of cylindrical segments or sections of different materials with substantially the same diameter, and the cylindrical segments or sections are stacked one upon another in the direction in which the plasma stream flows.

Furthermore, according to the present invention, the cylindrical target may consist of a plurality of cylindrical segments or sections, each of which is electrically connected independently to a separate sputtering power supply so that the sputtering of each cylindrical segment or section can be controlled independently of each other.

The specimen table may be insulated electrically from the plasma formation chamber.

Further, a first gas introduction system may be coupled to the plasma formation chamber. In addition, a second gas introduction system may be coupled to the specimen chamber.

The above and other objects, effects, features and advantages of the present invention will become more apparent from the following description of preferred embodiments thereof taken in conjunction with the accompanying drawings.

BRIEF DESCRIPTION OF THE DRAWINGS

FIG. 2 is a schematic diagram used to explain the underlying principle of the plasma deposition by the first embodiment as shown in FIG. 1;

FIG. 3 illustrates a relationship between a sputtering power and a deposition rate of aluminum (Al), as a characteristic of the plasma deposition according to the present invention, the data being obtained from the experiments conducted by the inventors;

DETAILED DESCRIPTION OF THE PREFERRED EMBODIMENTS

Figure 1:
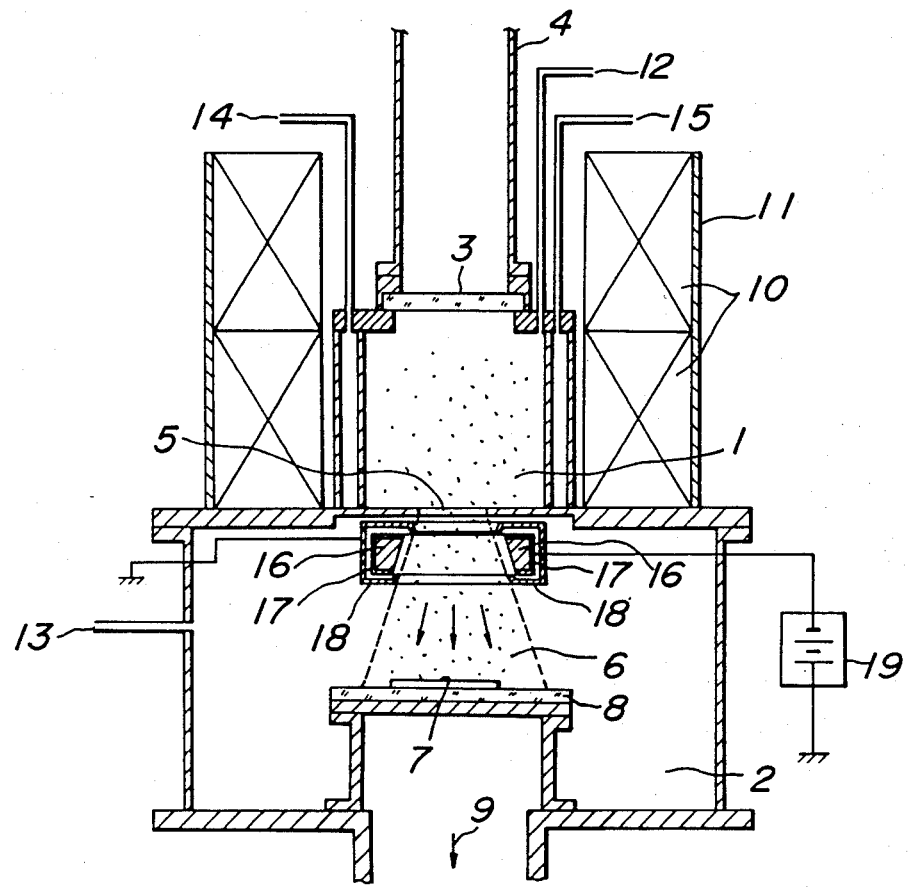
FIG. 1 is a sectional view showing a first embodiment of a plasma deposition apparatus according to the present invention.
Figure 4:
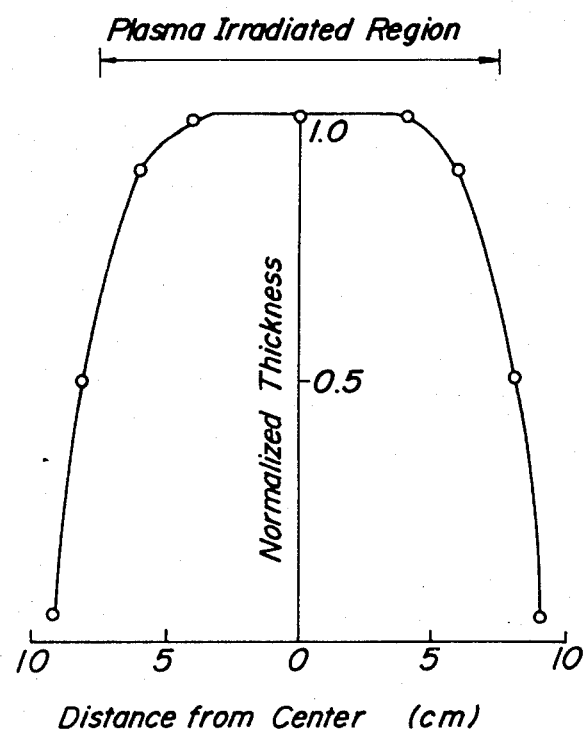
FIG. 4 illustrates a distribution of the deposition of a film over a substrate.

Same reference numerals are used to designate similar parts throughout the figures.

FIG. 1 show a first embodiment of a plasma deposition apparatus according to the present invention, in which reference numeral 1 designates a plasma formation chamber; 2 a specimen chamber and 3 a microwave introducing window or aperture which may be made of fused quartz. A magnetron operating as a frequency of 2.45 GHz may be used as a microwave source (not shown) for generating microwave which is introduced from a rectangular waveguide 4 through the microwave window 3 into the plasma formation chamber 1.

In the plasma formation chamber 1, a plasma extraction window or aperture 5 is disposed in opposite to the microwave window 5 so that a plasma stream 6 is extracted from the plasma formation chamber 1 and directed toward a specimen substrate 7 placed on a specimen table 8. The specimen chamber 2 is communicated with a vacuum system 9 which may comprise a control valve for controlling a volume of an exhaust gas to be evacuated, a liquid nitrogen trap, an oil diffusion pump with an exhausting capacity of 2,400 l/sec and an oil rotary pump with an exhausting capacity of 500 l/min (each, not shown).

It is preferable that the plasma formation chamber 1 is so designed and constructed as to function as a microwave cavity resonator so that an electrical field strength of the microwave can be increased and the microwave discharge efficiency can be improved. Therefore, for instance, a circular cavity resonance mode $TE_{112}$ may be employed. According to the first embodiment, the plasma formation chamber 1 is a cylinder which is 15 cm in inner diameter and 15 cm in inner height. According to a theoretical calculation, when the cylindrical plasma formation chamber 1 is 15 cm in inner diameter, its inner height must be about 14 cm in order to satisfy the above condition of microwave cavity resonator. Here, the variations in wavelength in the case of the counterclockwise circularly polarized wave after the generation of the plasma is taken into consideration, so that the inner height is determined as 15 cm. The wavelength of the clockwise circularly polarized wave which directly couples with cyclotron electrons is sufficiently shortened as the plasma is produced, so that it is not necessary to strictly define the inner dimensions after the plasma has been produced. The plasma extraction window 5 may be, for instance, a circular aperture having a diameter of 6 cm.

Magnetic coils 10 surround the plasma formation chamber 1. It is to be noted that an intensity of the magnetic field produced by the magnetic coils 10 is so determined as to satisfy a condition of electron cyclotron resonance by microwave at least in one portion within the plasma formation chamber 1. When the microwave has a frequency of 2.45 GHz, the magnetic flux density of 875 G is required to satisfy the condition of electron cyclotron resonance. Therefore, the magnetic coils 10 are so designed and constructed as to produce a magnetic flux density of at least 875 G in the plasma formation chamber 1. In addition, the magnetic coils 10 are so arranged that the magnetic field produced by the magnetic coils 10 not only serves to cause the electron cyclotron resonance in the plasma formation chamber 1 but also extends into the specimen chamber 2. That is, the magnetic filed serves to form a divergent magnetic field so that the intensity of the magnetic field in the specimen chamber 2 is gradually decreased from the plasma extraction window 5 toward the specimen table 8. Consequently, the magnetic field also serves to extract the plasma stream 6 from the plasma formation chamber 1 to the specimen table 8.

An interaction between a magnetic moment of an electron which is raised to a higher energy state by electron cyclotron resonance and moves circularly and a gradient of the diverging magnetic field accelerates the electrons to move circularly along the lines of magnetic force toward the specimen table 8. The surface of the specimen table 8 is electrically insulated from the plasma formation chamber 1, so that the specimen table 8 produces a negative potential. As a result, an electric field is established in the plasma stream in such a way that the ions which include ions of the sputtered atoms are accelerated, while the electrons are decelerated. Accordingly, the conditions are maintained that electrons and ions, the number of which is the same as the number of the electrons, reach the specimen table 8. That is, because of the diverging magnetic field, the energies of electrons are converted into the energies of ions with which the ions are incident on the specimen table 8. Consequently, an efficient deposition and formation of a film can be ensured by suitable ion bombardment. In this case, the ion energy is on the order of 5 to 30 eV, the value of which can be controlled by a microwave power and a gas pressure. This means that a quality of a thin film to be obtained can be controlled flexibly with respect to a variety of materials of such a thin film.

In order to introduce gases into the plasma deposition apparatus, there are provided a first gas introduction system 12 for introducing Ar, $N_2$, $O_2$, $H_2$ or the like into the plasma formation chamber 1 so that plasma may be produced and a second gas introduction system 13 for introducing a raw material gas such as $SiH_4$, $N_2$, $O_2$ into the specimen chamber 2. Further, there are some cases, in accordance with a thin film to be formed, where the second gas introduction system 13 is not required.

In order to cool the plasma formation chamber 1, cooling water is introduced to the wall portion of the plasma formation chamber 1 through a cooling water inlet 14 and discharged through a cooling water outlet 15. In a like manner, the specimen table 8 as well as the magnetic coils 10 can be cooled.

The first embodiment described above may substantially be similar in construction to the plasma deposition apparatus disclosed in U.S. patent application Ser. No. 257,616.

According to the present invention, a ring-shaped sputtering target 16 made of a sputtering material such as Al, Mo, Ta or Nb is disposed in the vicinity of the plasma extraction window 5 within the specimen chamber 2 in such a way that the ring-shaped sputtering target 16 surrounds and is made adjacent to or in contact with the plasma stream 6. The target 16 is attached to a target electrode 17 and the outer periphery of the target 16 which does not face the plasma stream 6 is preferably surrounded by a shield electrode 18 with a distance of 5-10 mm. The shield electrode 18 is grounded. Consequently, abnormal discharge such as spark-over of the target 16 or undesired ion incidence to the target 16 can be avoided.

The target electrode 17 is connected to a sputtering power supply 19 which may be, for instance, a DC power supply with a maximum voltage of 1,000 V and a maximum current of 1 A. A high frequency power supply may also be used as the sputtering power supply 19 like in the case of high frequency sputtering apparatus. A water cooling system for cooling the target electrode 17 may be provided.

The target electrode 17 is so connected to the power supply 19 that the target electrode 17 is negatively charged. For instance, when plasma is produced by introducing, for example, Ar through the first gas introduction system 12 into the plasma formation chamber 1 in order to form a thin film of metal M, the argon ions $Ar^+$ in the plasma stream 6 are accelerated by a negative potential ($-100$ to $-1000$ V) of the sputtering target 16 so that they impinge against the surface of the target 16 as shown in FIG. 2. As a result, the atoms of the metal M, which constitutes the sputtering target 16, are sputtered and emitted to the plasma stream 6. The sputtered atoms collide with the electrons in the plasma stream 6 so that they are ionized to become $M^+$. The ions $M^+$ are transported by the electric field, which is established in the plasma stream 6 by the diverging magnetic field, toward the specimen table 8 and reach the specimen substrate 7 with a suitable energy and directivity, which promote the reaction for forming a film. The thus reached ions are deposited on the specimen 7 to form a film of the metal M.

In this case, the incident energies of sputtered and ionized atoms as well as the impact of other ions in the plasma stream play an important role in promoting the reaction for forming a film.

The surface of the sputtering target 16 is substantially in parallel with the direction of the magnetic field so that the secondary electrons e emitted from the target 16 are caught by the lines of magnetic force to makes a drift movement in the vicinity of the surface of the target 16 while circularly moving and is finally trapped to the target 16. Therefore, by the same mechanism as in the case of magnetron discharge, the sputtering efficiency is increased. Furthermore, the secondary electrons e do not cause abnormal discharge or disturbance of an electric field in the plasma stream 6, but serve to stabilize the ion bombardment against the target 16. Experimental results showed that the highly stabilized operation was carried out. The intensity of the magnetic field produced by the magnetic coils 10 was 300–400 G in this region and is substantially equal to the intensity of the magnetic field on the surface of a target of a magnetron sputtering apparatus.

Next, specific examples of characteristics of the plasma deposition apparatus in accordance with the present invention will be described. When an argon gas Ar is introduced through the first gas introduction system 12 into the plasma formation chamber 1, the stable discharge was maintained in the plasma formation chamber 1 over a wide range of the gas pressure from $1 \times 10^{-3}$ Pa to 1 Pa or more. An optimum gas pressure range was between $1 \times 10^{-2}$ Pa and 1 Pa.

When the sputtering target 16 was made of aluminum (Al), the microwave power was 100 W and the voltage of the sputtering power supply 19 was 500 V, the target current of 400 mA flew through the target 16. In this case, the sputtering reaction due to argon ion bombardment against the target 16 was caused. As a result, the whole plasma stream 6 showed deep blue. Thus, it was observed that the aluminum (Al) atoms were being uniformly sputtered.

FIG. 3 illustrates the relationship between a power of the sputtering power supply and a deposition rate of aluminum (Al) when the gas pressure was within a range from $6 \times 10^{-2}$ Pa to $6 \times 10^{-1}$ Pa. Under these conditions, the deposition rate was about 200 Å/min. It is seen that with the increase of the microwave power, an ion current (i.e., the current supplied from the sputtering power supply) as well as a deposition rate are easily increased.

According to the present invention, a sputtered atom M is ionized to $M+$ in the plasma stream 6 as shown in FIG. 2 and entrained in the plasma stream 6 so that the ionized ion $M+$ is transported to the specimen table 8 to form a thin film. Therefore, a thin film is formed only at a restricted region of the specimen table 8 which is irradiated by the plasma stream 6; that is, the region of 15 cm in diameter in this example. Thus, a thin film can be formed in an efficient manner. In addition, a thin film is uniformly formed in this region. Especially in the region of 10 cm in diameter from the center, the uniformity of less than ±5% was obtained.

Furthermore, the ions to be deposited and other ions in the plasma stream have a suitable amount of energies as described above so that it is possible to form a high quality film which strongly adheres to a substrate. Even though an aluminum (Al) film was formed at room temperature, the film had a thickness of 1 μm and had mirror like surface. Furthermore, even if a substrate such as a Teflon substrate with a poor degree of adhesivity was used, a film with a good adhesion to the substrate was formed on the substrate.

When a mixture gas consisting of Ar and $O_2$ (or a sole gas of $O_2$) is introduced through the first gas introduction system 12, or when Ar is introduced through the first gas introduction system 12 and $O_2$ is introduced through the second gas introduction system 13, and when an aluminum (Al) target 16 is used, a dense and high quality $Al_2O_3$ film can be formed. If $N_2$ is introduced instead of $O_2$, and AlN film can be formed. When the sputtering target 16 is made of Mo, W, Ta, Nb or other materials a Mo, W, Ta, Nb film, a film of the other material, or a film of an oxide or nitride of Mo, W, Ta, Nb or the other material can be formed. Furthermore, when an $SiH_4$ gas is introduced through the second gas introduction system 13, a film of an alloy of Si and metal or a film of silicide such as $MoSi_2$, $WSi_2$ or the like may be formed. That is, according to the present invention, various kinds of high quality films such as metal films, chemical compound films or alloy films can be formed at a low temperature depending upon the combinations of gases introduced through the first and second gas introduction systems 12 and 13 and a sputtering material of the target 16.

Further, while the shape of the sputtering target 16 may be determined in a desired manner, the inner surface of the target 16 which faces the plasma stream 6 may be disposed in parallel with the plasma stream 6. Alternatively, it is preferable that the target 16 is in the form of a cylinder which surrounds the plasma stream 6 and intersects with a part of the plasma stream 6.

As to the shape and structure of the target, instead of the target 16 made of a pure metal and in the form of a ring as shown in the above embodiment, the target 16 may consist of a substrate and a sputtering material formed on the inner surface of the substrate. Alternatively, the target 16 may consists of a plurality of thin sputtering plates arrange in the form of a ring. Moreover, the target 16 may consist of a bulk structure of a sputtering material. In this way, the size and shape of the target 16 may be selected depending upon its applications.

So far the target electrode and the shield electrode have been formed as a ring, but it is to be understood that the present invention is not limited to the ring shaped target and shield electrodes and that various modifications can be effected. For instance, they may consist of one or more split segments on the surface which faces the plasma stream 6.

Figure 5:
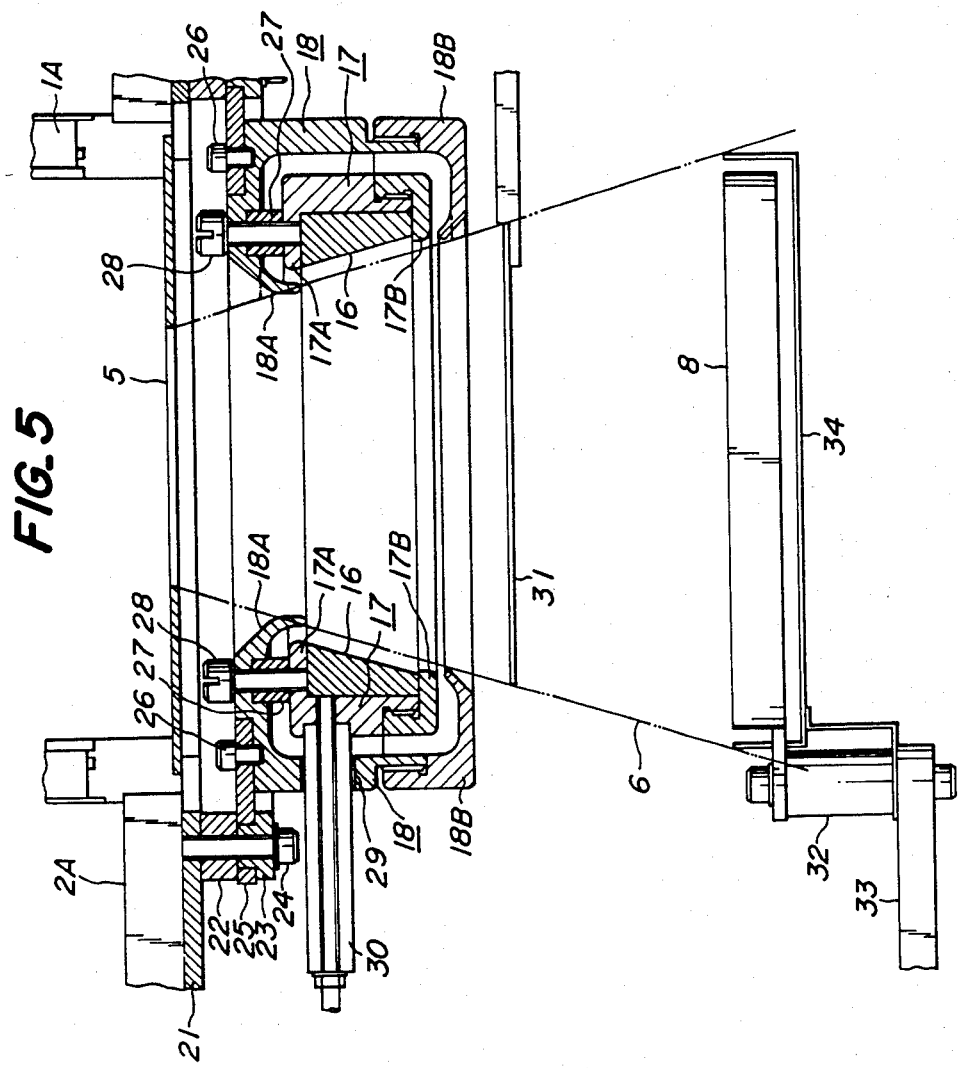
FIG. 5 is a sectional view showing in detail one embodiment of the construction and arrangement of a target and a shield electrode in the first embodiment as shown in FIG. 1.

Next, a detailed embodiment of an arrangement of the target and shield electrodes 17 and 18 is shown in FIG. 5. In FIG. 5, portions corresponding to FIG. 1 are denoted by the same reference numerals as in FIG. 1. The plasma formation chamber 1 is 150 mm in inner diameter and 150 mm in inner height. The diameter of the plasma extraction window 5 is made variable, for example, can be varied to 50 mm, 60 mm and 70 mm. Reference numeral 1A designates the cylindrical side wall of the plasma formation chamber 1 and 2A the top plate of the specimen chamber 2 which consists of a disc 21 with an aperture greater than the window 5 of the plasma formation chamber 1. The disc 21 is securely attached to the top plate 2A via ring shaped metal spacers 22 and 23 by bolts 24. The lower ring 23 has a stepped portion and a ring shaped plate 25 having a center opening through which the plasma stream 6 passes is inserted into the stepped portion of the lower ring 23 and clamped between the upper and lower rings 22 and 23. An upper shield electrode 18A is securely attached to the ring shaped plate 25 by bolts 26. The upper shield electrode 18A has a ring shaped portion which is radially inwardly flared and is substantially in contact with the conically shaped boundary surface of the plasma stream 6. Inside the ring shaped and flared portion, via a ring shaped insulating spacer 27 made of, for example, MACOR (the trademark of the product of Corning Glass Works), the upper portion of the target electrode 17 is clamped to the upper shield electrode 18A by bolts 28 in a manner that the target electrode 17 is electrically insulated from the upper shield electrode 18A. A through hole 29 is formed in the cylindrical wall of the upper shield electrode 18A and a terminal 30 is attached through the hole 29 to the target electrode 17, so that a current flows from the sputtering power supply 19 to the target 16.

The target electrode 17 consists of a ring shaped upper target electrode 17A and a ring shaped lower target electrode 17B which are threadly engaged with each other, as shown in FIG. 5. The target 17 having a outer diameter of 130 mm and a height of 30 mm is accommodated in the space defined by the upper and lower target electrodes 17A and 17B. The lower end portion of the upper shield electrode 18A is threadably engaged with a ring shaped lower shield electrode 18B which has a radially inwardly extended flange portion.

In order to install the target 16 or replace the target 16 with a new one, the lower target electrode 17B and the shield electrode 18B are removed and then the ring shaped target 16 is accommodated between the upper and lower target electrodes 17A and 17B. Then, the lower target electrode 17 and the lower shield electrode 18B are threadably engaged with the upper target electrode 17A and the upper shield electrode 18A, respectively. The shield electrodes 18A and 18B may have a radially inwardly extended flange portion as indicated by the dotted lines instead of the radially inwardly flared portion shown in FIG. 5.

A shutter 31 having a diameter of 125 mm, for example, is disposed below this type of electrode structure, for example, 10 mm below the lower shield electrode 18B so that the passage or the interruption of the plasma stream 6 is controlled.

The specimen table 8 is water cooled and is securely fixed to an arm 33 through a spacer 32 made of MACOR. The arm 33 is securely attached to the side wall of the specimen chamber 2. A shield plate 34 is disposed immediately below the specimen table 8 and is securely fixed to the arm 33.

Such a structure of the specimen table 8 as described above is advantageous when a high frequency power supply or a DC power supply is connected to the specimen table 8 so that energies of ions incident to the specimen table 8 is further increased or controlled (See U.S. patent application Serial No. 257,616). The specimen table 8 may be provided with a cooling means.

Figure 6:
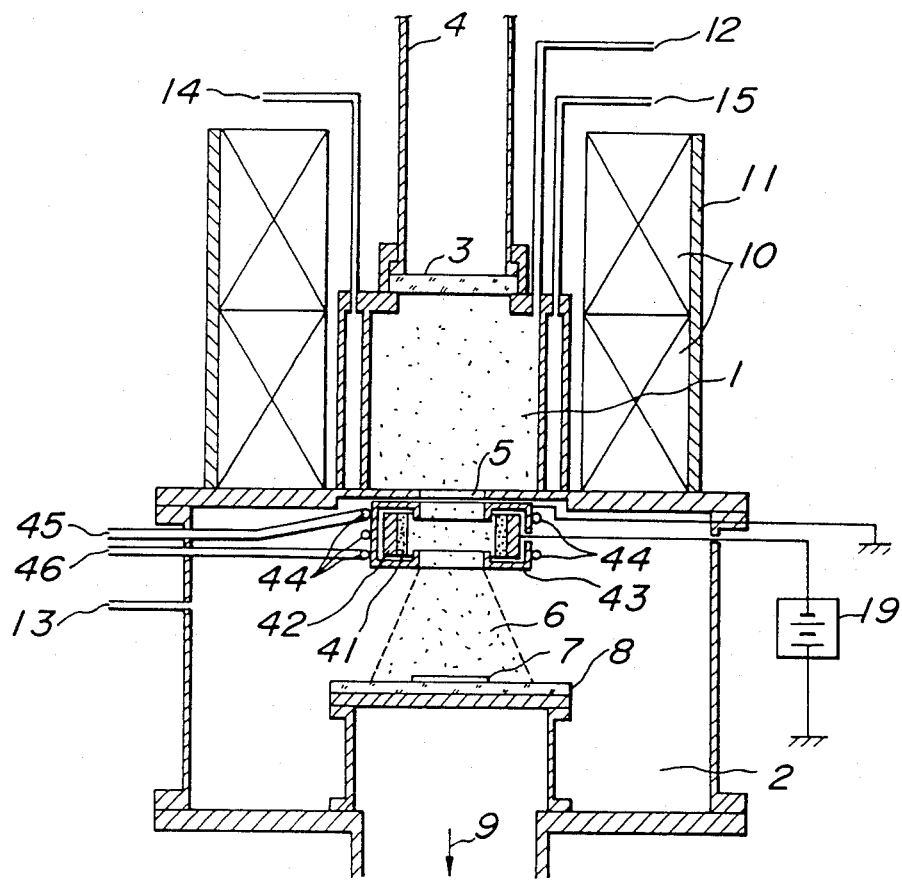
FIG. 6 is a sectional view showing a second embodiment of the present invention.

A second embodiment of the present invention is shown in FIG. 6, in which portions corresponding to these in FIG. 1 are denoted by the same reference numeral and the explanations thereof are eliminated. This embodiment is substantially similar in construction to the first embodiment as shown in FIG. 1 except the arrangement of a target 41 and its associated portions. That is, a cylindrical sputtering target 41 made of a sputtering material such as Al, Mo, Ta or Nb is disposed in the vicinity of the plasma extraction window 5 in the plasma formation chamber 1 so as to surround and come into contact with a part of the plasma stream 6. The target 41 is mounted to a ring like target holder 42. A portion of the target 41 which does not face the plasma stream 6 is surrounded by a shield electrode 43 which is grounded and is radially outwardly spaced apart from the holder 42 by 5–10 mm, so that abnormal discharge such as spark discharge of the target 41 or impingement of undesired ions against the target 41 is prevented.

A cooling pipe or tube 44 surrounds the shield electrode 43 and cooling water flows from an inlet 45 into the cooling pipe or tube 44 and flows out of an outlet 46, so that the shield electrode 43 is cooled and hence the sputtering target 41 is cooled by the transfer of heat radiation from the target 41 to the shield electrode 43. Consequently, a thin film can be formed in a stabilized manner.

The heat transfer by radiation in vacuum can be obtained theoretically in accordance with Stefan-Boltzmann law. That is, the heat transfer is proportional to the fourth power of an absolute temperature. When the temperature of the sputtering target 41 is equal to or more than 200° C., the heat is sufficiently transferred to the shield electrodes 43 so that the sputtering target 41 can be satisfactorily cooled. In the second embodiment, the inner surface of the cylindrical target 41 is substantially perpendicular to the major surface of the specimen substrate 7, so that the heat radiated from the inner surface of the cylindrical target 41 hardly influences the specimen substrate 7. Therefore, it suffices in this structure that the target 41 is cooled to the extent that the target 41 is not deformed or the properties of the target 41 are not changed. According to the second embodiment, the target 41 can be satisfactorily cooled by the heat transfer by radiation between the target 41 and the shield electrode 43. Moreover, it is not necessary that the target 41 itself is provided with a cooling mechanism so that this structure is advantageous to simplify a target structure.

Further, as far as the film formation is concerned, negative ions are produced on the surface of the target 41 and are emitted from and perpendicularly to the surface of the target with an energy of the target voltage. In a prior art sputtering process, such negative ions damage the surface of a specimen, but according to the second embodiment of the present invention, such particles having a high energy reach again the inner cylindrical surface of the target 41 and do not reach the surface of the specimen substrate 7. As a result, the surface of the specimen 7 is not damaged and only particles having energies which is optimum to the formation of a film reach the surface of the specimen substrate 7.

Referring again to FIG. 6, the sputtering target 41 is electrically connected through the holder 42 to the power supply 19 which is, for example, a DC power supply with a maximum voltage of 1,000 V and a maximum current of 1 A. The sputtering power supply 19 may be a high frequency power supply like in the case of high frequency sputtering process. The sputtering target 41 is connected to the power supply 19 in such a way that the target 41 is negatively charged.

Figure 7:
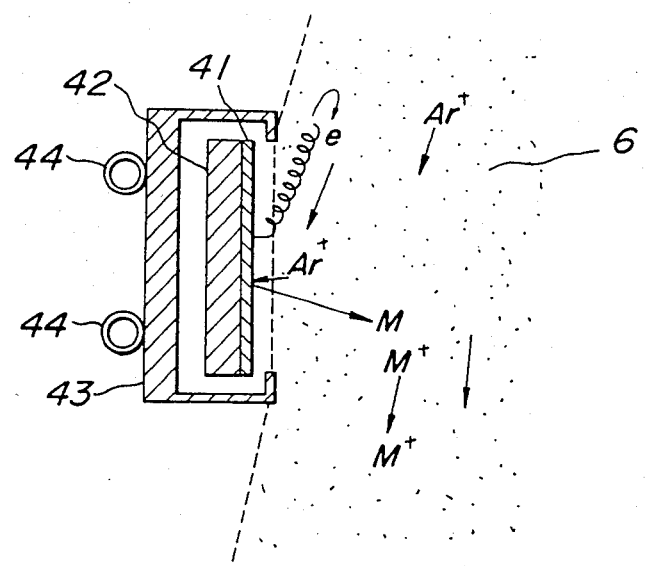
FIG. 7 is a schematic diagram used to explain the underlying principle of the plasma deposition by the second embodiment as shown in FIG. 6.

When plasma is produced by introducing, for example, an argon (Ar) gas through the first gas introduction system 12 into the plasma formation chamber 1 in order to form a thin film of metal M, the argon ion Ar+ in the plasma stream 6 are accelerated by a negative potential ($-100$ through $-1000$ V) of the sputtering target 41 so that they strike against the surface of the target 41 as shown in FIG. 7. As a result, the atoms of the metal M, which constitutes the sputtering target 41, are sputtered and emitted to the plasma stream 6. The sputtered atoms collide with the electrons in the plasma stream so that they are ionized to become M+. The ions M+ are transported by the electric field, which is produced by the diverging magnetic field in the plasma stream 6, toward the specimen table 8 and reach the surface of the specimen substrate 7 with a suitable energy and directivity, which promote the reaction for forming a film. The thus reached ions are deposited on the specimen substrate 7 to form a film of the metal M.

Like in the first embodiment, in addition to the metal film, a variety of thin films such as a film of oxide, a film of nitride, a film of silicide, a film of chemical compound, an alloy film and so on of sputtering raw materials can be formed in a desired manner in accordance with the combination of gases to be introduced and sputtering materials.

As shown in FIG. 7, the upper stream side of the plasma stream 6 has a strong magnetic field, while the down stream side has a weak magnetic field. Because of the interaction between the gradient of such the magnetic field and the negative potential at the surface of the target 41, electrons e as well as secondary electrons emitted from the surface of the target 41 are trapped between the plasma stream 6 and the surface of the target 41. As a result, a plasma density of the plasma stream 6 is increased in the vicinity of the surface of the target 41, so that the surface of the specimen substrate 7 is not damaged. Furthermore, abnormal discharge can be avoided and the ionization efficiency can be improved.

Figure 8:
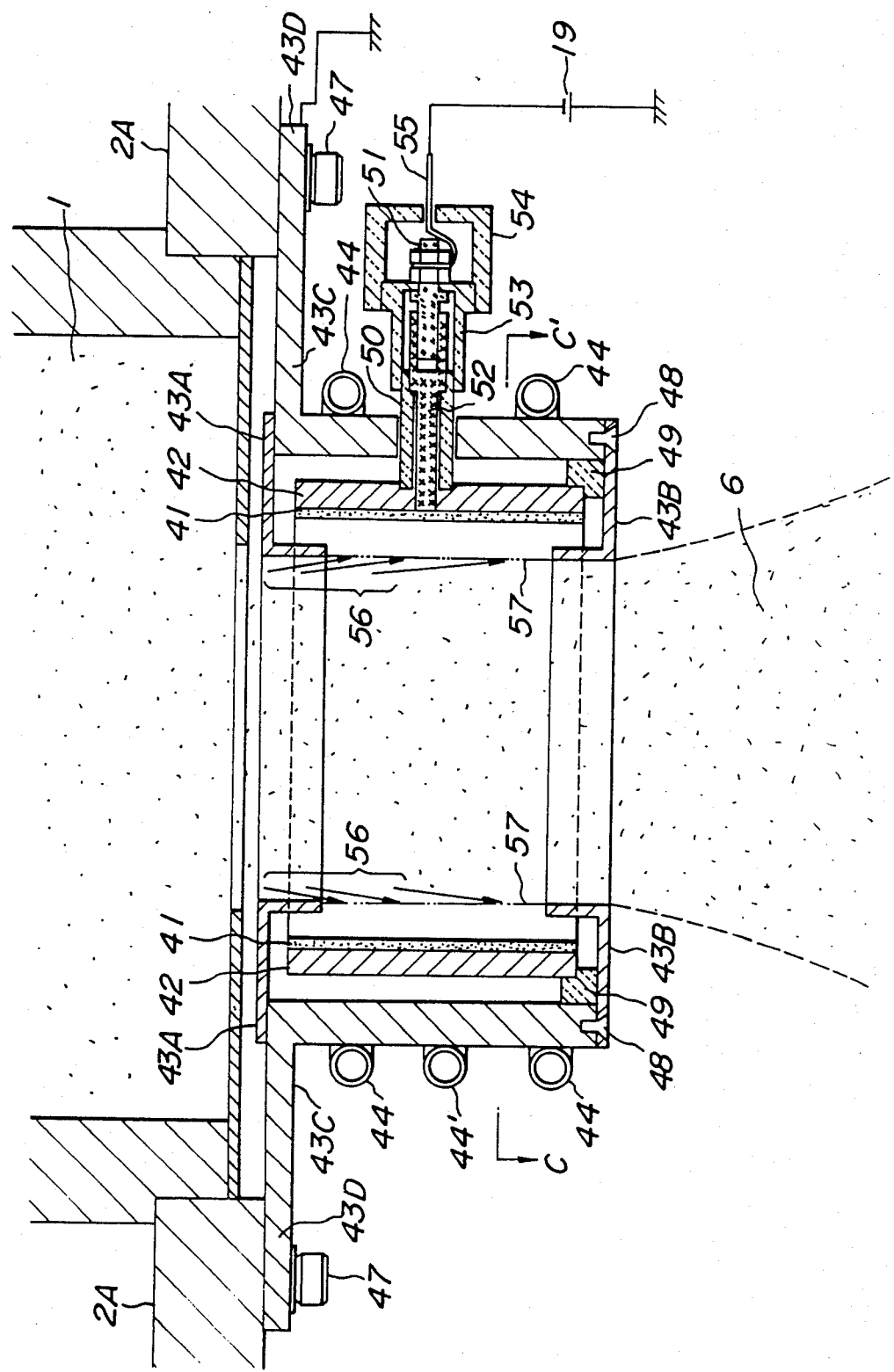
FIG. 8 is a sectional view showing in detail one embodiment of the construction and arrangement of a target and a shield electrode in the second embodiment as shown in FIG. 6.

A detailed embodiment of an arrangement of the sputtering target 41 and its associated portions in the plasma deposition apparatus shown in FIG. 6 is shown in FIG. 8. Here, the shield electrode 43 consists of an upper shield electrode 43A, a lower shield electrode 43B and a peripheral shield electrode 43C interposed between the upper and lower electrodes 43A and 43B. A flange 43D of the intermediate shield electrode 43C is securely attached by screws 47 to the top member 2A of the specimen chamber 2. Since the shield electrode 43 is grounded, it can be directly attached to the specimen chamber 2. Each of the upper and lower shield electrode 43A and 43B is in the form of a ring with an upright flange and both the upper and lower electrodes 43A and 43B or only the lower shield electrode 43B is removably attached to the peripheral shield electrode 43C by screws 48. A ring-shaped insulating spacer 49 made of a working ceramic, for example, MACOR, the trade mark of the product of Corning Glass Works is interposed between the lower shield electrode 43B and the target holder 42 in such a way that the target holder 42, i.e., the sputtering target 41 is supported by the spacer 49.

According to the second embodiment of the present invention, the target 41 is in the form of a cylinder so that its construction is very simple. That is, a striplike sheet of sputtering material may be folded into the form of a cylinder and then inserted into the target holder 42 to follow the inner surface of the holder 42. Therefore, various kinds of sputtering materials can be used easily and in an inexpensive manner. In one example of the second embodiment, the wall thickness of the cylindrical target holder 42 may be 5 mm, the inner diameter thereof may be 84 mm and the wall thickness of the cylindrical target 41 may be 2 mm. In this way, the cylindrical target 41 may have a thin wall thickness, and thus various kinds of sputtering materials in the form of stripe can be used to form a cylinder easily. Furthermore, the replacement of the target 41 is very simple.

Referring still to FIG. 8, a supporting cylinder 50 is protruded from the holder 42 and is radially outwardly extended through the peripheral shield electrode 43C. An electrode 52 is secured to the inside of the supporting cylinder 50. One end of the electrode 52 is brought into electrical contact with the outer cylindrical wall surface of the sputtering target 41. The outer end of the electrode 52 has an extended blind hole which receives a pin 51 for supplying an electrical power from the power supply 19. The pin 51 is supported by and extended through a first insulating cylinder 53 which is fittable to the supporting cylinder 50. Another or second insulating cylinder 54 is fitted to the first insulating cylinder 53, so that a portion in which the free end of the pin 51 is connected to a feed line 55 from the power supply 19 is accommodated inside of the second insulating cylinder 54. In this way, the pin 51 is made insertable to the electrode 52, so that a power from the power supply 19 can be supplied to the target 41.

Furthermore, the cooling pipe or tube 44 may surround the peripheral electrode 43C, so that the sputtering target 41 is cooled by the heat transfer by radiation and that the temperature rise of the specimen substrate and the inside of the specimen chamber is prevented. As a result of this structure, a thin film may be formed in a stabilized manner.

Since the ions 56 in the plasma stream which are generated in the plasma formation chamber 1 and transported by the diverging magnetic field flow into a plasma sheath 57 in an efficient manner, so that the target current is increased and consequently the deposition rate is improved. As a result of the interaction between the negative potential on the target surface and the gradient of the diverging magnetic field, the electrons are trapped between the plasma formation chamber 1 and the sputtering target 41, so that the abnormal discharge may be prevented and the ionization efficiency can be improved.

Figure 9:
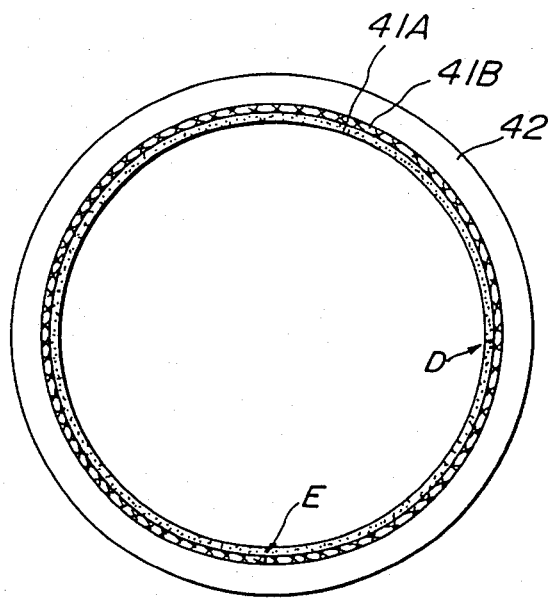
FIG. 9 is a sectional view showing in an enlarged scale, an embodiment of the target in the second embodiment.

FIG. 9 is a sectional view of a detailed embodiment of the target 41 shown in FIG. 8 taken along the line C-C' of FIG. 8, i.e., the provision of a circular target by stripe materials. Here, reference numeral 41A designates an inner cylindrical target, 41B an outer cylindrical target and 42, a cylindrical holder. The seams of the inner and outer cylindrical targets 41A and 41B are indicated by D and E, respectively. When a stripe sheet of sputtering material is formed into a cylinder, that is, the inner or outer cylindrical target 41A or 41B, the cylindrical holder 42 is exposed, unless the both edges of the seams of the sputtering material sheets are made into very intimate contact with each other. Therefore, if the cylindrical target and its holder are made of different materials, alien atoms from the target holder 42 are mixed into a film so that a film with a desired degree of purity cannot be obtained. To cope with this problem of seam, it is generally considered that the seam portion is jointed by welding. But, sometimes it is impossible to employ welding depending upon sputtering materials, and even if the edges of the seam are welded together, some impurities is likely to be included in the weld. Especially, in case of a thin sheet of a sputtering material, the weld may be raised, so that a precise provision of the cylindrical sputtering target is difficult. According to the present invention, however, two cylindrical targets 41A and 41B are superposed or laminated one upon another and fitted into the holder 42. Therefore, the cylindrical targets 41A and 41B can easily be mounted. That is, it suffices to form a stripe of a sputtering material into a cylinder with a predetermined diameter without the need of jointing such as welding of the seam. More particularly, it is sufficient that the cylindrical targets 41A and 41B are fitted into the cylindrical holder 46 in such a way that their seams D and E may not overlap each other as shown in FIG. 9. In this case, as both the cylindrical sputtering targets 41A and 41B having an outwardly expanding force are provided, they can securely be fitted into the cylindrical holder 46. Furthermore, at the time of sputtering thermal stresses are produced in the cylindrical sputtering targets 41A and 41B, so that they can further firmly about against the cylindrical holder 42.

Figure 10:
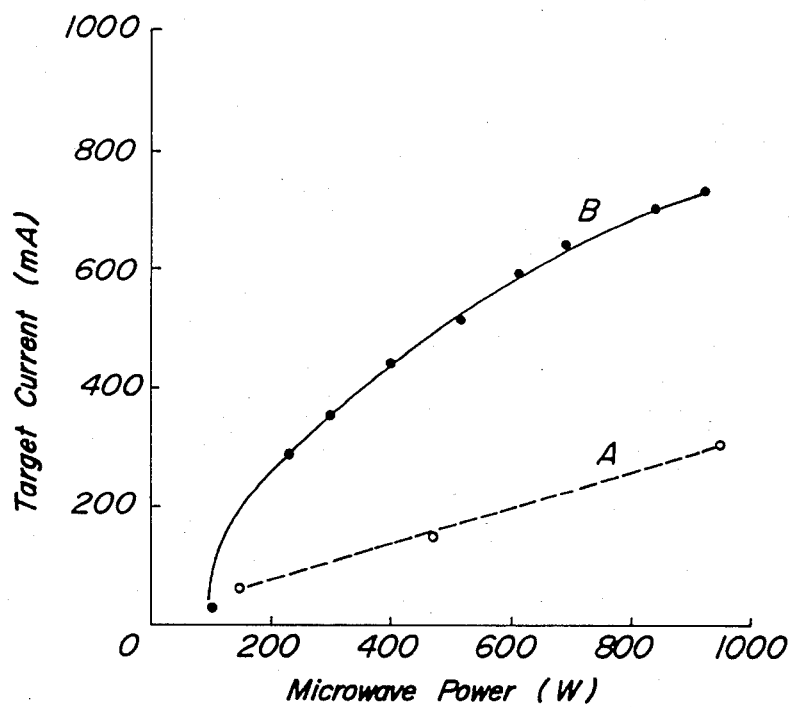
FIG. 10 illustrates a relationship between a microwave power and a target current.

FIG. 10 illustrates effects and features of the present invention, in which a relationship between a microwave power and a target current is shown under the conditions that the argon gas pressure is $8 \times 10^{-2}$ Pa and the target voltage is 500 V. The target current represents a value of current per a target area of 100 cm$^2$. The characteristic curve A shows the relationship when the conical target as shown in FIG. 1 was used, while the characteristic curve B shows the relationship when the cylindrical target as shown in FIG. 6 was used. It is seen that when the cylindrical target was used (the curve B), the target current more three times higher than the target current when the conical target was used (the curve A) was obtained, because of the ion flow effect and the electron trap as described above. Furthermore, even if the target has such a high current (i.e., high power), the plasma deposition apparatus can be operated in a stable manner for a long time because the target is efficiently cooled.

Figure 11:
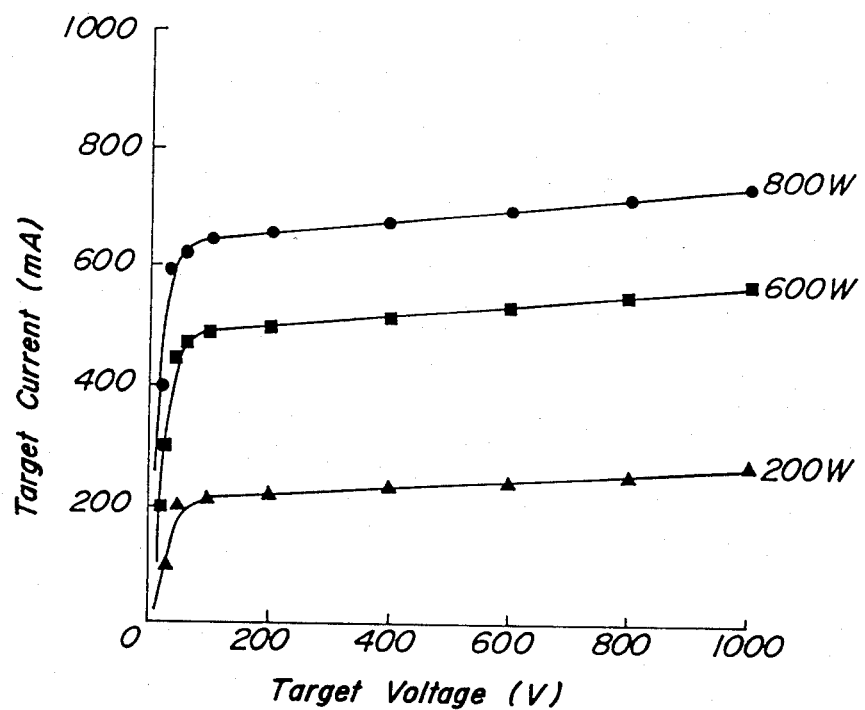
FIG. 11 illustrates a relationship between a target voltage and a target current with a microwave power being used as a parameter.

FIG. 11 illustrates a relationship between a target voltage and a target current when the sputtering target in accordance with the present invention was used under the condition that an argon gas pressure was $8 \times 10^{-2}$ Pa. It is seen that the target current increases rapidly until the target voltage rises to 50 V and thereafter the target current remains substantially constant. That is, the characteristic curves are almost flat. The target current can be controlled by the microwave power. Accordingly, an optimum target current and an optimum target power can be obtained flexibly and with a good controllability depending upon a variety of sputtering materials. Even if a microwave power for producing the plasma is constant, the target power, i.e., (target voltage)×(target current), which has a relation with a film deposition rate, can be increased by changing the target voltage. Accordingly, the conditions for producing plasma and the conditions for depositing a film can substantially independently be controlled.

Figure 12:
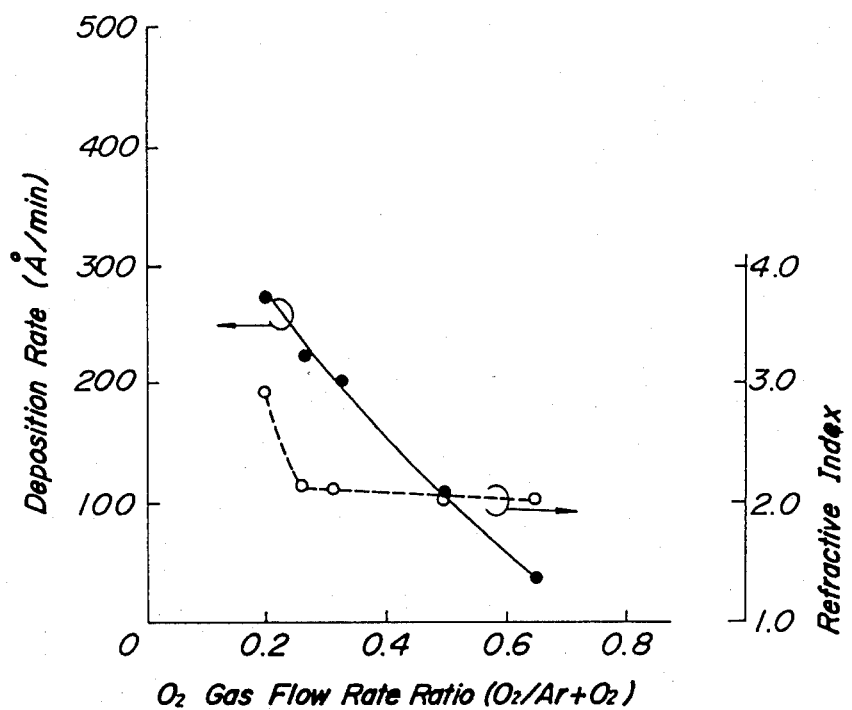
FIG. 12 illustrates deposition characteristics of $Ta_2O_5$ films obtained in accordance with the present invention.

FIG. 12 illustrates an example of a film deposition in accordance with the present invention or a relationships of a deposition rate (Å/min) and a refractive index with an O$_2$ flow rate ratio (O$_2$/Ar+O$_2$) under the conditions that the target 41 was made of Ta and that Ar was introduced through the first gas introduction system 12, while O$_2$ was introduced through the second gas introduction system 13 so that a Ta$_2$O$_5$ film was formed. The total flow rate of Ar and O$_2$ was 15 cc/min and the target power was 3 W/cm$^2$. The substrate 7 was made of Si and was attached to the specimen table 8 which was water cooled. The temperature of the substrate 7 was about 45° C. With the increase of the O$_2$ flow rate ratio, the deposition rate was decreased. In contrast, a refractive index was deceased with the increase of the O$_2$ flow rate ratio until the ratio increased to 0.25. When the O$_2$ flow rate ratio exceeds 0.25, a refractive index is maintained constant at a value inherent to the Ta$_2$O$_5$ film. Since highly active ECR plasma was utilized, the reaction between Ta and O$_2$ proceeds sufficiently, even if the film deposition was performed at a high deposition rate as high as 200 Å/min. Therefore, a high quality film with an inherent refractive index was obtained with a good adherability. Even though the substrate 7 is not heated and the film is formed at a low temperature, the etching rate was about 20 Å/min when a buffered hydrofluoric acid (50% hydrofluoric acid: 40% ammonia fluoride=1:1, at 20° C.) was used. A dense film comparable to those obtained by conventional sputtering processes or thermal oxidation processes was obtained. When this Ta$_2$O$_5$ film was applied to a gate film of a MOS diode, a dielectric constant of 22 was obtained. Good diode characteristics were observed in that the production of surface level due to surface damage or the like was extremely less and the surface charge was also very small.

As described above, according to the present invention, sputtering targets made of various sputtering materials can easily be used and combined with a highly active ECR plasma so that a high quality thin film can be formed at a low temperature. While only one kind of sputtering material in combination with gases has been described to form a thin film, it is to be understood that since the construction and arrangement of the target is simple, a film of metal compound or alloy can easily be formed by utilizing a plurality of sputtering materials.

Two embodiment of the present invention in which a plurality of target materials are used will be described with reference to FIGS. 13 and 14.

Figure 13:
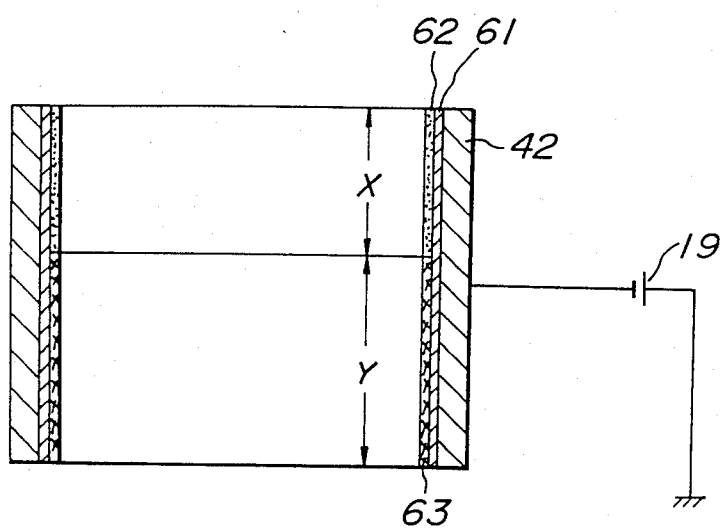
FIG. 13 is a longitudinal sectional view showing another embodiment of a target in accordance with the present invention.

FIG. 13 shows an embodiment in which two target materials are used. First, an outer cylindrical target 61 is fitted into a cylindrical target holder 42 and a first or upper inner cylindrical target 62 and a second or lower inner cylindrical target 63, both of which have substantially the same diameter, are inserted into the outer cylindrical target 61 in coaxial relationship with each other and with the outer cylindrical target 61, in a manner that the inner cylindrical targets 62 and 63 are stacked one upon another in the direction of the plasma stream. It is preferable that the outer cylindrical target is made of the same sputtering materials as the first or second inner cylindrical target 62 or 63. A sputtering voltage is applied to the target assembly consisting of the outer cylindrical target 61 and the first and second inner cylindrical targets 62 and 63 from the power supply 19. A ratio of compositions of the two target materials in a thin film can flexibly be controlled in accordance with a ratio X/Y, where X is a width of the first or upper cylindrical target 62 and Y is a width of the second or lower cylindrical target 63.

Figure 14:
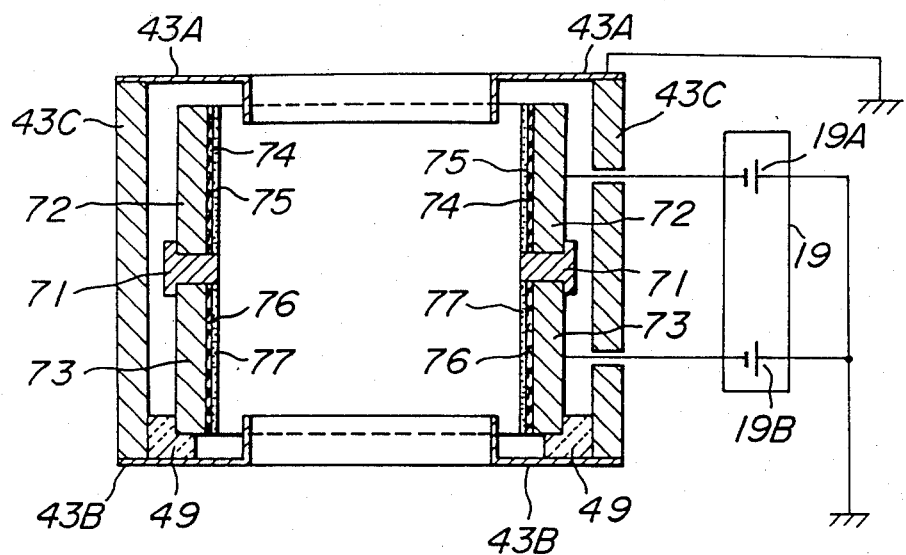
FIG. 14 is a longitudinal sectional view showing a fourth embodiment of a target in accordance with the present invention.

FIG. 14 shows an embodiment of a target assembly in which sputtering voltages are applied to two target segments independently. In this embodiment, a upper cylindrical target holder 72 and a lower cylindrical target holder 73 are coupled to each other by an insulating ring 71 while they are electrically insulated from each other by the insulating ring 71. A first outer cylindrical target 74 and a first inner cylindrical target 75 are snugly coaxially fitted into the upper holder 72 while a second outer cylindrical target 76 and a second inner cylindrical target 77 are snugly coaxially fitted into the lower holder 73. The cylindrical target segments 74 and 76 have substantially the same diameter and the cylindrical target segments 75 and 77 have substantially the same diameter. The two sets of the cylindrical target segments are disposed via the insulating ring 71 within the shield electrode 43. Voltages derived from a first and a second power supply 19A and 19B are applied independently to the upper and the lower sets of the target segments.

When two kinds of target materials are disposed to form a thin film in this manner, the sputtered particles are emitted to the central portions of the plasma stream and transported to the specimen table 8 by the transporting effect of the plasma stream. Consequently, an extremely uniform thin film is formed within the surface of the substrate 7. Each target segment is made of a sole material, so that there occurs no ununiformity of a thin film in a direction of the thickness due to a variation of a sputter component as the lapse of time, which is a problem in a target having a mixture of target materials. The arrangement as shown in FIG. 14 is very effective in case that it is necessary to finely control sputtering rates when a thin film is made of sputtering materials having extremely different sputtering rate. While the target having two kinds of materials have been used in the above explanation, it is to be understood that the present invention may equally be advantageous when more than two sputtering materials are used and can easily be applied to form a thin film consisting of various materials.

As described above, according to the present invention, a solid material may be used as a raw material for forming a thin film. The material is sputtered so that atoms or are emitted from the surface thereof. The sputtered atoms are imparted with a kinetic energy which is optimum to the deposition to a substrate so that a thin film is formed. Accordingly, a combination of various kinds of sputtering materials with the introduction of various kinds of gases leads to the formation of a high quality film of various components may be formed at a low temperature. Furthermore, unlike conventional sputtering processes, according to the present invention, plasma is produced independently of sputtering by a microwave discharge using electron cyclotron resonance. As a result, the sputtering can be accomplished in a stabilized manner over a wide range of gas pressure from $10^{-5}$ Torr to $10^{-2}$ Torr or more. Moreover, according to the present invention, the kinetic energy imparted to the sputtered atoms may be varied by a microwave power and the pressures of various gases introduced may be varied over a wide range. Furthermore, partial pressures of gases introduced from the first and second gas introduction systems can be determined pertinently so that qualities of a thin film to be formed may be controlled over a wide range. The sputtered and ionized atoms and molecules are directed by the plasma stream toward the specimen substrate, so that an adhesion efficiency can be improved and that no film is formed over the undesired region of the specimen chamber. As a consequence, the consumption of the target can be reduced to a minimum and the contamination within the sputtering apparatus can also be reduced to a minimum. As a result, the maintenance is facilitated and a high yield is ensured.

Furthermore, according to the present invention, a highly active plasma can be produced even at a low gas pressure, so that a high quality film of various compounds such as oxides, nitrides can be formed at a high speed by introducing reaction gases. Moreover, the conditions for producing plasma and the conditions for depositing a film can independently be controlled so that the physical properties of the film can be controlled easily. An ion energy is a suitable level on the order of 5–30 eV, so that the reaction of the formation of a thin film can be promoted and the thin film is securely deposited to the substrate. Furthermore, the damage of sputtering to the surface of a semiconductor substrate is minimum. Since a film is formed at a low temperature, various kinds of films may be formed on the surface of a substrate of a polymer material or photoresist. Therefore, the present invention can advantageously be applied to the fabrication of a very large scale integrated device which requires a low temperature processing and to the fabrication of a compound semiconductor device such as GaAs, InP which is thermally unstable. Moreover, the present invention may equally be applied to the coating of various materials.

If the sputtering target is in the form of a cylinder so that its sputter surface is perpendicular to the plasma stream, the ions in the plasma stream efficiently strikes against the target surface so that the target current is increased and the deposition rate is also improved. In addition, electrons are trapped by the interaction between the negative potential of the target and the diverging magnetic field, so that the generation of ions is enhanced. At the same time, the abnormal discharge can be avoided. The cylindrical target is simple in construction. That is, a stripe sheet of sputtering material can be curved into the form of a cylinder. Therefore, various sputtering materials can be used easily and inexpensively. Furthermore, a plurality of stripe sheets of sputtering materials can be used so that a film of various alloys can be obtained easily and uniformly. In addition, in this case, the target surface is perpendicular to the surface of a specimen, so that the target can be cooled by cooling the shield electrode which is easily cooled. Thus, it is not necessary to attach a water cooling pipe or tube to the target, so that the replacement of the target is facilitated.

While in the above embodiments of the present invention the sputtering by an inert gas such as an argon gas has been used to supply a metal M, it is to be understood that an argon (Ar) gas may be mixed with a halogen gas such as $Cl_2$, or a sole halogen gas may be used in a reactive sputtering process to supply the metal M so that a deposition rate may be improved. As far as a manner of supplying the metal M by sputtering process, the halogen gas attains a sputtering rate far higher than that in case of the inert gas such as Ar, since the halogen gas accompanies a chemical reaction in which volatile halides are produced. As a result, the efficiency of supplying the metal M is increased, so that a high deposition rate can be achieved. In this case, metal halides emitted to a plasma stream collide with electrons in the plasma stream so that they are decomposed and ionized. Therefore, a thin film can be formed in a manner substantially similar to a mechanism where a gas of metal halides is introduced in ECR plasma deposition process (See U.S. patent application Ser. No. 257,616). In the latter case, there are advantages that a solid target of the metal M is used and that it is not required to provide a special gas introduction system for supplying metal halide by reactive sputtering process. Furthermore, there is an advantage that a metal halide with a high boiling point can easily be supplied.

What is claimed is:

1. A plasma deposition method comprising the steps of:
    (a) introducing a gas into a vacuum vessel to produce a plasma stream of ions
    (b) sputtering a target disposed about said plasma stream and made of a sputtering material by ions in (a) said plasma stream;
    (c) ionizng atoms which are sputtered from said target into said plasma stream; and
    (d) transporting the ionized atoms together with said plasma stream to a specimen substrate so that said ionized atoms reach said specimen substrate to form a thin film including said sputtering material on said specimen substrate.

2. A plasma deposition apparatus comprising: (a) a plasma formation chamber into which a gas is introduced to produce plasma;
    (b) a specimen chamber in which a specimen table is disposed for placing thereon a specimen substrate on which a thin film is to be formed;
    (c) a plasma extraction window interposed between said plasma formation chamber and said specimen chamber through which a high energy plasma stream passes;
    (d) means for mounting a target which is made of a sputtering material and is interposed between said plasma extraction window and said specimen table about said plasma stream so that extracted plasma ions produce sputtering of said target;
    (e) a first means for extracting ions for sputtering said target from said plasma stream to impinge against said target, and
    (f) a second means for extracting said plasma stream through said plasma extraction window into said specimen chamber and for transporting the sputtered and ionized atoms to said specimen substrate placed on said specimen table to form said thin film thereon.

3. A plasma deposition apparatus as claimed in claim 2, wherein the surface of said target which faces said plasma stream is disposed in parallel with said plasma stream.

4. A plasma deposition apparatus as claimed in claim 2, wherein said target is in the form of a cylinder, and is so disposed as to surround said plasma stream.

5. A plasma deposition apparatus as claimed in claim 4, wherein the surface of said cylindrical target which is to be sputtered is so disposed as to intersect with a part of said plasma stream.

6. A plasma deposition apparatus as claimed in claim 3, wherein said plasma formation chamber is structured in a manner that said plasma is produced by microwave electron cyclotron resonance discharge.

7. A plasma deposition apparatus as claimed in claim 6, wherein said second means comprises one or more magnetic coils having a diverging magnetic field with an intensity of magnetic field having a reducing gradient from said plasma formation chamber toward said specimen chamber.

8. A plasma deposition apparatus as claimed in claim 3, wherein said first means has a sputtering power supply connected in such a way that a negative voltage is applied to said target.

9. A plasma deposition apparatus as claimed in claim 3, wherein the surface of said target which is opposite to the surface which faces said plasma stream is surrounded with a shield electrode.

10. A plasma deposition apparatus as claimed in claim 9, further comprising means for cooling said shield electrode.

11. A plasma deposition apparatus as claimed in claim 5, wherein said cylindrical target comprises a plurality of cylindrical segments which are made of different sputtering materials and are disposed in a coaxial relationship with each other.

12. A plasma deposition apparatus as claimed in claim 5, wherein said cylindrical target comprises a plurality of cylindrical segments which are made of different sputtering materials and have substantially the same diameter, and said plurality of cylindrical segments are stacked one upon another in the direction of said plasma stream.

13. A plasma deposition apparatus as claimed in claim 5, wherein said target comprises a plurality of target segments, which are electrically connected independently to separate sputtering power supplies so that the sputtering of each segment is controlled independently of each other.

14. A plasma deposition apparatus as claimed in claim 3, wherein said specimen table is electrically insulated from said plasma formation chamber.

15. A plasma deposition apparatus as claimed in claim 3, wherein a first gas introduction system is coupled to said plasma formation chamber.

16. A plasma deposition apparatus as claimed in claim 15, wherein a second gas introduction system is coupled to said specimen chamber.

* * * * *